United States Patent [19]

Kitajima et al.

[11] 4,210,711

[45] Jul. 1, 1980

[54] PROCESS FOR FORMING AN IMAGE

[75] Inventors: Masao Kitajima; Hiromichi Tachikawa; Fumiaki Shinozaki; Tomoaki Ikeda, all of Asaka, Japan

[73] Assignee: Fuji Photo Film Co., Ltd., Kanagawa, Japan

[21] Appl. No.: 966,996

[22] Filed: Dec. 6, 1978

[30] Foreign Application Priority Data

Dec. 6, 1977 [JP] Japan ................................ 52-145684

[51] Int. Cl.[2] .................... G03C 11/12; G03C 5/00
[52] U.S. Cl. ................................ 430/253; 430/143; 430/151; 430/254; 430/255; 430/258; 430/262; 430/325; 430/326; 430/330; 430/353
[58] Field of Search .............. 96/28, 35, 114.1, 115 R, 96/48 HD

[56] References Cited

U.S. PATENT DOCUMENTS

| | | | |
|---|---|---|---|
| 3,060,023 | 10/1962 | Burg et al. | 96/115 P |
| 3,353,955 | 11/1967 | Colgrove | 96/28 |
| 3,703,373 | 11/1972 | Alsup et al. | 96/28 |
| 3,721,557 | 3/1973 | Inoue | 96/28 |
| 3,941,596 | 3/1976 | Heiart | 96/28 |
| 3,970,453 | 7/1976 | Belli et al. | 96/28 |

Primary Examiner—J. Travis Brown
Attorney, Agent, or Firm—Sughrue, Rothwell, Mion, Zinn & Macpeak

[57] ABSTRACT

A process for forming an image is disclosed wherein a photo-sensitive image-forming material composed of a support and a layer of a thermoplastic photo-sensitive composition which is not adhesive at ordinary temperatures, is exposed and developed by heating in intimate contact with a peeling development carrier sheet at least one surface of which is composed of a thermoplastic material not adhesive at ordinary temperatures, and, subsequently, peeling the development carrier sheet from the photo-sensitive image-forming material.

18 Claims, 5 Drawing Figures

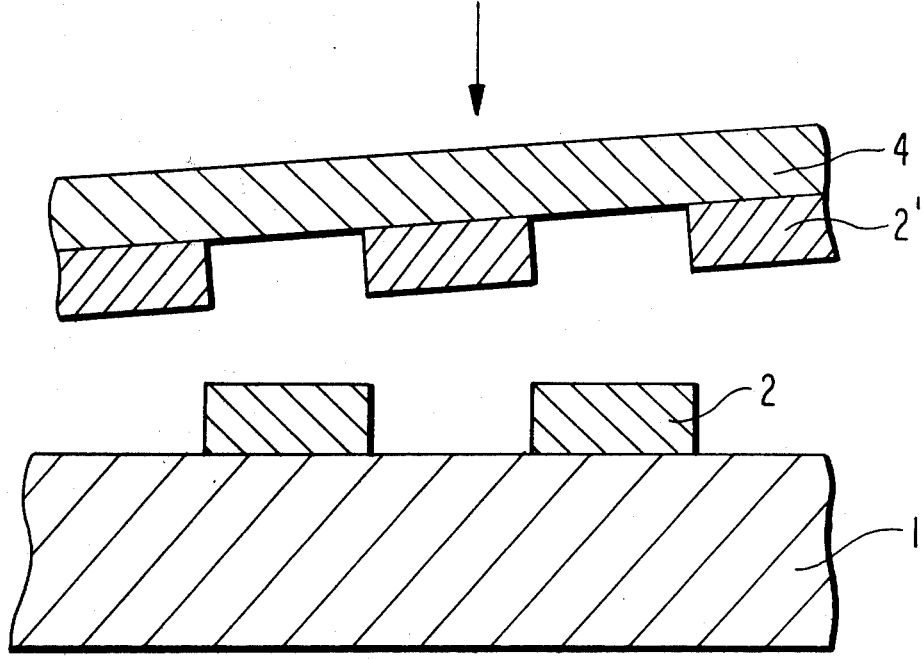

PROCESS FOR FORMING AN IMAGE

BACKGROUND OF THE INVENTION

1. Field of the Invention

This invention relates to a process for forming an image, and especially to a method for obtaining a relief image which comprises imagewise exposing a photo-sensitive image-forming material and subjecting it to dry development.

2. Brief Description of the Prior Art

More specifically, the invention relates to a process for forming an image, which comprises imagewise exposing a photo-sensitive image-forming material composed of a support and a photo-sensitive composition layer formed thereon, heating the exposed image-forming material in intimate contact with a peeling development carrier sheet having a plastic layer which is non-adhesive to the photo-sensitive layer at ordinary temperatures but on heating, is softened and becomes adhesive to the photo-sensitive layer, and then separating the image-forming material from the peeling development carrier sheet under heat to leave only the exposed area or the unexposed area of the photo-sensitive layer selectively on the carrier sheet and the corresponding unexposed area of the exposed area on the support, both as a separate relief image.

Many methods for forming images by the dry development of a photo-sensitive composition have been suggested heretofore which include, for example, developing an exposed photo-sensitive material by heating, a thermal-developing method by a suitable radiation ray, by treatment with a gas, by electrostatic treatment, and by the application of pressure.

One typical dry developing method is disclosed in Japanese Patent Publication No. 9663/63 which is a so-called peeling development process utilizing a photo-sensitive image-forming material composed of a support, a layer of a photo-sensitive composition on the support and a cover sheet placed on the photo-sensitive layer in which the adhesion of the photo-sensitive layer to the support and to the cover sheet changes upon exposure. After exposure, the support is peeled from the cover sheet to leave only the exposed areas of the photo-sensitive layer on the support or the cover sheet and the unexposed area on the other, both as a relief image.

The method of image formation by peeling development is operated in the dry state, and the operation is simpler than ordinary liquid development using a large quantity of water or solvent. Furthermore, it is only the image area of the photo-sensitive image-forming composition layer which remains on the support after peeling, and the non-image area is removed from the support by peeling. Accordingly, this method also has the advantage that the stabilization of the non-image area (which is essential to a photo-sensitive materials developed by an ordinary liquid developing or thermodeveloping method) that is, its fixation, can be performed simultaneously with the developing operation. Since in the peeling development method, the photo-sensitive composition in the non-image area is fixed to the peeled sheet as a solid layer, it can be disposed of easily, and this is desirable from the standpoint of environmental preservation. When the composition contains useful ingredients, they can be completely recovered and easily re-used. Thus, this processing method is advantageous from the viewpoint of saving resources, too.

Since a general procedure for image formation by peeling was published in Japanese Patent Publication No. 9663/63, a number of specific techniques have been suggested. These techniques are classified by their basic characteristics, and briefly described below.

A three-layer structure composed of a support, a photo-sensitive layer containing a photopolymerizable monomer and a cover sheet laminated to the photo-sensitive layer constitutes a very important in the art. Peeling development of this photo-sensitive material is performed by utilizing the fact that polymerization proceeds in the exposed area of the material, and therefore, the adhesion of the photo-sensitive layer to the support and to the cover sheet differs between the exposed area and unexposed area. It is described, for example, in Japanese Patent Publication No. 3193/62 (U.S. Pat. No. 3,060,024), Japanese Patent Publication No. 22901/68 (U.S. Pat. No. 3,353,955), Japanese Patent Application (OPI) No. 7728/72 (U.S. Pat. No. 3,770,438) and U.S. Pat. Nos. 3,060,023 and 3,525,615. U.S. Pat. Nos. 3,627,529, 3,591,377 and 3,607,264 disclose a similar peel-developable photo-sensitive material consisting essentially of a support, a photo-sensitive layer and a transparent cover sheet in which the photo-sensitive composition layer contains a photocurable polyester (U.S. Pat. No. 3,591,377), a photocurable olefin compound (U.S. Pat. No. 3,607,264) or a photocuring catalyst and a thiol-containing olefin polymer (U.S. Pat. 3,627,529).

The methods described above perform peeling development by utilizing changes in adhesion incident to the photochemical reaction of a photopolymerizable monomer of a photocurable compound.

Methods using other photo-sensitive compounds are also known. For example, Japanese Patent Application (OPI) No. 57819/77 discloses a method which comprises using a laminate structure composed of a sheet consisting of a support and an adhesive composition layer formed thereon, and a transparent plastic film coated with a photo-sensitive composition comprising a diazonium salt and a binder, exposing the laminate structure, and then peeling the film thereby to leave the unexposed area of the photo-sensitive composition layer on the transparent plastic film and the exposed area on the support.

Japanese Patent Application (OPI) No. 3215/78 (U.S. patent application Ser. No. 810,828, filed June 28, 1977) discloses an invention relating to a method which uses a similar sheet composed of a support and an adhesive composition layer formed thereon. A thin film layer comprising a metal or chalcogen is further provided between the support and a photo-sensitive composition layer to form a five-layer laminate structure. It utilizes the phenomenon that peeling development after exposure induces selective separation at the interface between the non-sensitive thin film layer and the support.

In the invention disclosed in Japanese Patent Application (OPI) No. 23632/78, a photo-sensitive composition containing a polyhalogen compound and a polymer having a phenol nucleus is used, and by peeling a transparent film-like material adhering to the photo-sensitive composition layer before or after exposure, an image corresponding to the exposed image is obtained on the support.

British Pat. No. 1,319,295 discloses a peeling development method which comprises laminating a heat-softenable polymeric layer and a powder capable of absorbing infrared rays to a support, exposing the resultant material to infrared rays to impart tackiness imagewise to the heat-softenable polymeric layer, and separating the polymeric layer from the support to form an image on the support.

Methods have also been published in which compounds having various characteristics are incorporated into such peel-developable photo-sensitive materials for use in special applications.

For example, U.S. Pat. No. 3,060,024 suggested the selective adhesion of a powder of a coloring agent to the unexposed area (unpolymerized area) by utilizing the tackiness of this area.

Numerous suggestions have been made as to the use of polymer images obtained by peeling development for photoresists, and have been disclosed, for example, in Japanese Patent Application (OPI) Nos. 120825/75 and 39025/76, and U.S. Pat. No. 3,660,088.

A process for producing a printing plate by peeling development of a photo-sensitive material including an inkrepellent silicone or fluorine-containing compound in a layer of a photopolymerizable or photocurable composition is disclosed, for example, in Japanese Patent Application (OPI) Nos. 94503/73, 66304/75, (W. German Patent Application (OLS) No. 2,449,172), 58105/76, 121330/76 and 134204/76.

So far, the characteristics of known techniques about image formation by peeling have been described. Heretofore, the basic principle of peeling development lies in the changing of the adhesion between the photo-sensitive composition layer and the support by light. For example, a photopolymerizable or photocurable photo-sensitive composition is used, and by a photochemical composition at the exposed area the adhesion of the photo-sensitive layer to the support is decreased or increased from that before exposure, whereby the exposed area and the unexposed area are formed as images separated on different supports. For example, Japanese Patent Publication No. 9663/63 suggested a method for forming an image which comprises exposing a photo-sensitive composition in intimate contact with a cover sheet and peeling the cover sheet by utilizing the fact that the photo-sensitive adhesive layer has suitable tackiness at room temperature.

On the other hand, Japanese Patent Application (OPI) Nos. 57819/77, 3215/78 and 141003/76, for example, disclose a method in which the adhesiveness of the photo-sensitive composition layer itself at room temperature is not essential. In such a method, the adhesiveness required for peeling development is gained by providing a pressure-sensitive adhesive layer on a peeling sheet used as a cover sheet. In these techniques, an adhesive peeling sheet is adhered intimately to the photo-sensitive composition layer before or after imagewise exposure, and then it can be peeled off. Accordingly, a broad range of selection for the characteristics of the photo-sensitive composition is possible than the aforesaid methods which use a photopolymerizable compound as a material and utilize the tackiness of the photo-sensitive composition layer itself at ordinary temperatures.

Some techniques for separating an image more effectively by heating the image-forming material at the time of peeling have been disclosed. For example, U.S. Pat. No. 3,060,023, discloses a method which comprises using a mixture of a photopolymerizable monomer and a thermoplastic polymer as a photo-sensitive composition layer, and after exposure, bringing the photo-sensitive layer into intimate contact with a receptor sheet at a temperature of at least 40° C. thereby to soften the unexposed area, i.e. the unpolymerized area of the photopolymerizable monomer, selectively and to transfer the image thermally onto the receptor sheet. This technique utilizes the transfer of the unexposed area (unpolymerized area) of the thermoplastic photopolymerizable composition to the receptor sheet under heat, and it affords a number of copies by bringing the exposed photopolymerizable composition layer into contact with a suitable support to transfer the unexposed area under heat. Since in this method, a transfer image composed of the unpolymerized area is always utilized as an image, when it is desired to utilize the image obtained on the support further for a printing plate or a photoresist, it is necessary to provide an additional step of curing the transferred image by an after treatment such as exposure.

Japanese Patent Application (OPI) No. 39025/76 discloses a method which comprises imagewise exposing a three-layer image-forming material composed of a metal substrate, a layer of a photo-sensitive composition comprising an addition-polymerizable monomer and polyvinyl butyral and a cover sheet, and peeling the exposed material while heating it, thereby to induce cohesive destruction of the unexposed area (i.e., unpolymerized area) of the photo-sensitive layer and to obtain the same positive image as used in imagewise exposure on the metal substrate which image is utilized as a photoresist image.

Thus, in the conventional techniques, the heating operation is utilized only for the purpose of increasing the flowability of the unexposed area of the photo-sensitive image-forming layer in the transferring step. The specification of Japanese Patent Application (OPI) No. 3215/78 gives a description about the effect of heating before peeling in one working example. However, the photo-sensitive image-forming material used in this example includes a layer of an adhesive composition as an essential ingredient of the peeling development carrier, and the heating operation does not play an essential role in regard to the imparting of adhesiveness between the peeling development sheet and the image-forming layer.

SUMMARY OF THE INVENTION

A principal object of the present invention is to provide a process for peeling development wherein photo-sensitive materials, previously thought unsuitable for peeling development methods, are used.

Another object of the present invention is to provide a process for peeling development wherein the layer of photo-sensitive composition and the peeling development carrier sheet are not adhesive or tacky at ordinary temperatures.

A further object of this invention is to provide a process for peeling development which does not require covering the photo-sensitive layer before exposure such that intimate contact can be achieved between the photo-sensitive layer and the exposure transparency.

Another object of the present invention is to provide a peeling development method wherein relief images having good delineation are obtained both on the peeling development carrier sheet and the support for the photo-sensitive layer.

Still another object of the present invention is to provide relief images by a dry processing that can be used in lithographic printing plates, relief printing plates, gravure printing plates and photoresist.

These and other objects are accomplished in accordance with the present invention which is a method for forming an image which comprises imagewise exposing a photo-sensitive image-forming material composed of a support having coated thereon a layer of a photo-sensitive composition which is solid at room temperatures and is not adhesive but will be softened by heating, intimately contacting the exposed material under heat with a sheet-like carrier having a heat-softenable plastic layer which is not adhesive at room temperatures, and then separating the image-forming material from the peeling development carrier thereby to fix the exposed area or unexposed area of the photo-sensitive layer selectively to the peeling development sheet and obtain an image composed of the unexposed area or exposed area corresponding to the image on the peeling development sheet on the support as a relief.

Figure 1:
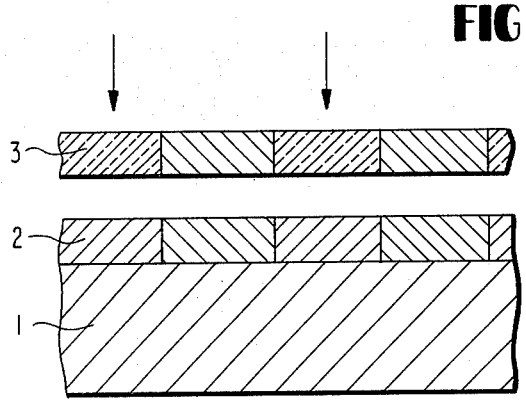
FIG. 1 illustrates a photo-sensitive image-forming material being exposed through a transparency in accordance with the present invention.

Generally, the following conditions must be satisfied to form good relief images by imagewise exposure of a photo-sensitive image-forming material composed of a support and a photo-sensitive composition layer, followed by peeling.

Let us suppose that immediately before a peeling operation, an image-forming carrier (B), a photo-sensitive composition layer (P) and a peeling development carrier sheet (H) are adhered to each other in this order. Assume the adhesion strength between the photo-sensitive layer and the image-forming carrier is $F_{PB}$ and the adhesion strength between the photo-sensitive layer, the peeling development carrier sheet is $F_{PH}$ and the cohesive force of the photo-sensitive layer is $f_p$. Then, in order to form a positive relief image on the image-forming carrier, the following conditions should be met.

$$F_{PB(D)} > F_{PH(D)} \tag{1}$$

$$F_{PB(L)} < F_{PH(L)} \tag{2}$$

$$F_{PH(D)} \leqq F_{PH(L)} \tag{3}$$

$$F_{PB(D)} \geqq F_{PB(L)} \tag{4}$$

(D) and (L) indicate the states before and after exposure, respectively. The equal signs of equations (3) and (4) do not hold good at the same time.

Furthermore, if the photo-sensitive layer itself undergoes cohesive destruction during peeling development, a good relief image will not be obtained. Hence, the cohesive force of the photo-sensitive layer should meet the following equations.

$$f_{P(D)} > F_{PH(D)} \tag{5}$$

$$f_{P(L)} > F_{PB(L)} \tag{6} \text{ PS}$$

Likewise, the conditions for obtaining a negative work relief image are that the inequality signs of equations (1) to (4) are reversed and simultaneously, the equations (5) and (6') should also be satisfied.

$$F_{PB(D)} < F_{PH(D)} \tag{1'}$$

$$F_{PB(L)} > F_{PH(L)} \tag{2'}$$

$$F_{PH(D)} \geqq F_{PH(L)} \tag{3'}$$

$$F_{PB(D)} \leqq F_{PB(L)} \tag{4'}$$

$$f_{P(D)} > F_{PB(D)} \tag{5'}$$

$$f_{P(L)} > F_{PH(L)} \tag{6'}$$

The values of these equations vary according to the temperature, humidity, pressure, atmosphere and other factors. However, if the conditions of equations (1) to (6) or (1') to (6') are satisfied at the time of image formation, i.e. peeling operation, relief images of positive work or negative work can be obtained.

The effect of temperature on the above conditions has been studied extensively and has led to the present invention. Specifically, the present invention is based on the discovery that the aforesaid conditions for image formation can be satisfied by exercising temperature control with a combination of a thermoplastic photo-sensitive image-forming layer and a thermoplastic peeling development carrier sheet.

The characteristic feature of the method of the present invention is that thermoplastic materials having no adhesiveness at room temperature are used as a photo-sensitive composition layer and a peeling development carrier sheet and they are heated under pressure in order to impart the adhesion strength required for peeling development and to achieve the conditions for forming a good relief image as stated hereinabove.

Since the photo-sensitive composition layer has no adhesiveness at room temperature, photo-sensitive image-forming materials obained by coating the photo-sensitive composition on a support do not adhere to each other during handling, and no cover sheet or protective layer for preventing adhesion is required contrary to the method disclosed in Japanese Patent Publication No. 9663/63 and many other known methods involving the use of photopolymerizable compositions.

It is also unnecessary to apply a cover sheet at the time of exposure, and the photo-sensitive image-forming material can be maintained in a state of being completely adhered to a transparency, i.e., in intimate contact with the transparency. Hence, this brings about the advantage that the decrease of resolving power by scattering or reflection of light during exposure can be minimized.

For example, when the present invention is applied to the making of a lithographic printing plate, it provides a method of dry processing after exposure of an image-forming material which can be in the same form as the presensitized lithographic printing plate (PS plate) now in general use.

Another feature of the process of this invention resides in a variety of photo-sensitive materials that can be used to form the photo-sensitive image-forming layer. By properly selecting and combining the binder, support, peeling development carrier sheet, the heating temperature and the peeling temperature, the method of this invention can use many photo-sensitive substances which have not been known to be suitable for image formation by peeling development.

The present invention pertains to a process for forming a relief image by dry processing an image-forming material having a photo-sensitive image-forming layer which is not adhesive at room temperature. The term "ordinary temperatures", as used herein, denotes temperatures which are frequently experienced in an ordinary natural environment, and ranges from about 5° C. to about 40° C.

The most important object of this invention is to provide a relief image on a support by dry processing a photo-sensitive image-forming material which is not adhesive at ordinary temperatures, and therefore does not require a cover sheet or the like during storage or exposure. To achieve this object, the image-forming layer should have a softening temperature at least about 10° C. higher than the ordinary temperature. On the other hand, since the dry development in accordance with this invention utilizes the change in adhesive strength between the photo-sensitive image-forming layer and the peeling development carrier incident to heating. A conventional adhesive tape which is tacky at ordinary temperatures decreases in adhesive strength when heated and the adhesive layer itself undergoes cohesive destruction. Hence, such an adhesive tape is not very suitable in this invention.

The adhesive surface of the peeling development carrier sheet which is to be adhered intimately to the photo-sensitive image-forming layer in peeling development is required to have suitable adhesive strength to remove the exposed or unexposed area of the photosensitive layer at the peeling development temperature and to not undergo cohesive destruction. That is to say the exposed image-forming material and the peeling development carrier sheet should have a softening point of at least 50° C.

The present invention provides a method for achieving the aforesaid object by properly choosing a suitable combination of the photo-sensitive substance, binder, support and the peeling development carrier sheet and the heat-bonding temperature and the peeling temperature. Various investigations have led to the discovery that it is important in the practice of the method of this invention that the adhesive surface of the peeling development carrier should have a softening point of at least 50° C.

The non-adhesiveness of the peeling development carrier at ordinary temperature is very advantageous for such operations as wind-up and position setting.

The easiest and most accurate means for bringing the peeling development carrier into intimate contact with the image-forming layer under heat is to pass them between a plurality of heated rollers. There are various other available methods such as pressure adhesion by means other than rollers, a combination of heating by thermic rays and pressure adhesion, the application of hot air, and heating by a superheated fluid such as water or oil.

Separation of the peeling development carrier and the image-forming layer after adhesion under heat can also be performed by various means. As in other peeling development methods, the speed of peeling and the angle formed between the peeling development carrier and the image-forming layer at the time of peeling (peel angle) affect the formation of images. Although it is difficult to determine the exact range of the peel speed and the peel angle, the speed of peeling is generally 0.1 cm/sec. to 100 cm/sec., preferably 0.5 cm/sec. to 20 cm/sec., and the preferred peel angle is 15° to 160°.

The constituent elements used in this invention are described in detail hereinbelow with reference to specific examples.

The photo-sensitive composition layer used in this invention contains a photo-sensitive substance, which photo-chemically reacts upon the irradiation of actinic light, and a binder as essential ingredients. The composition optionally contains additives used for imparting storage stability to the photo-sensitive compound, coloring images, and promoting peeling development, and for other purposes. The photo-sensitive composition used in this invention may contain photo-sensitive substances known to those skilled in the art. Specifically, they can be classified as follows:

A first group includes photo-decomposable compounds such as diazonium salts, o-quinonediazide compounds and aromatic azide compounds. Specific examples of these compounds known to those skilled in the art are disclosed, for example, in J. Kosar *Light-Sensitive Systems*, John Wiley & Sons, Inc., New York, (1965), pp 194 to 357.

A second group includes free radical photo-sensitive compositions consisting of a polyhalogen compound such as iodoform, carbon tetrabromide, α, α, α-tribromoacetophenone and tribromoethylphenylsulfone as the photo-sensitive substance in combination with diphenylamine, naphthol, phenol, etc. Specific examples are disclosed, for example, in a Japanese-language publication *Manual of Photographic Techniques*, Volume 1, by Takashi Yamamoto, a special issue of *Photographic Industry*, published by Photographic Industry Press (1977) at pages 192 to 204.

A third group includes photo-sensitive compositions containing quinones as a photo-sensitive substance, which are used in a method for forming an image by reducing a metal complex salt or oxide under heat by hydroquinone formed by photo-reduction of phenanthraquinone, naphthoquinone, benzoquinone, etc. Examples of the metal complex salts include organic tellurium compounds, and the cobalt (III) complex salts described in Japanese Patent Application (OPI) No. 139722/75.

A fourth group includes photo-sensitive polymers (or photoresists). Examples of this group are described, for example, in *Manual of Photographic Techniques*, ibid, Volume 1, by Tsuguo Yamaoka, a special issue of *Photographic Industry*, ibid, pages 172 to 191, and *Revised Edition, Photosensitive Resins* by Takahiro Sumida, published by the Publishing Department of the Japanese Society of Printing, 1976.

Specific examples include photohardenable photosensitive materials containing diazonium salts or aromatic bisamide compounds as photo-sensitive compounds, bichromate salt colloid photo-sensitive materials, polymers containing photo-sensitive groups, and photo-sensitive image-forming compositions based on the photopolymerization or photo-crosslinking of compounds containing vinyl groups using a carbonyl compound, a peroxide, a sulfur compound, a halogen compound, a photo-redox system, etc. as an initiator. The fourth group also includes vinyl cinnamate and polyvinyl cinnamylidene acetate.

A fifth group includes photo-sensitive materials containing silver halide, which are used in ordinary silver halide photographic techniques.

A sixth group includes photo-sensitive organic silver halides which are disclosed, for example, in Japanese Patent Publications No. 4921/68 and 4924/68.

Useful aromatic diazonium compounds are represented by the general formula $ArN_2^+X^-$ wherein $N_2$ represents a diazonium group ($-N^-=N^+$), Ar represents an aromatic moiety known to those skilled in the art to be useful for forming stable photo-sensitive diazonium compounds, and X represents an anion. These compounds are well known to those skilled in the art, and described, for example, in J. Kosar, *Light-Sensitive Systems*, John Wiley & Sons, Inc., New York, N.Y. (1965), pages 202–214, and Glafkides, *Photographic Chemistry*, Vol. II, Fountain Press, London, England (1960), pages 709–725.

Some of the diazonium salts of the general formula $ArN_2X$ are shown specifically below.

(1) Diazonium salts having a dialkylamino group introduced as an N-substituted amino group in the aforesaid residue:
4-(N,N-diethylamino)benzenediazonium salt,
4-(N,N-dimethylamino)dbenzenediazonium salt,
2-Methyl-4-(N,N-diethylamino)benzenediazonium salt,
2-Chloro-4-(N,N-diethylamino)benzenediazonium salt.

(2) Diazonium salts having a dialkylamino group introduced as an N-substituted amino group in the aforesaid residue, the two alkyl groups being different from each other:
4-(N-methyl-N-ethylamino)benzenediazonium salt.

(3) Diazonium salts having a phenylamino group introduced as an N-substituted amino group in the aforesaid residue:
4-(N-ethyl-N-benzylamino)benzenediazonium salt,
4-Anilinobenzenediazonium salt.

(4) Diazonium salts having a heterocyclic group introduced as an N-substituted amino group in the aforesaid residue:
4-Morpholinobenzenediazonium salt,
2,5-Dibutoxy-4-morpholinobenzenediazonium salt,
2,5-Diethoxy-4-morpholinobenzenediazonium salt,
2,5-Diethoxy-4-morpholinobenzenediazonium salt,
3-Methyl-4-pyrrolidinylbenzenediazonium salt.

(5) Diazonium salts containing as S-substituted-4-mercapto groups:
4-Ethylmercapto-2,5-diethoxybenzenediazonium salt,
4-Tolylmercapto-2,5-diethoxybenzenediazonium salt.

The diazonium salts which can be used in this invention are further classified by their structures, and illustrated below.

A first group includes those of the general formula in which Ar represents an N-substituted-4-aminobenzenediazonium group, N,N-substituted-4-amino-substituted benzenediazonium group or S-substituted-4-mercaptobenzenediazonium group, and X represents an anion. The N-substituted amino group includes, for example, a dialkylamino group, a dialkylamino group with the two alkyl groups being different from each other (examples of the alkyl group being methyl, ethyl, isopropyl), a phenylamino group or a heterocyclic group such as a morpholino, piperidino, piperazinyl or pyrrolidinyl group.

The benzene ring may be further substituted by an alkyl, alkoxy, phenoxy or trifluoromethyl group or a halogen atom. The substituted mercapto group may include an alkylthio or arylthio group (the alkyl groups being as provided for above for the alkylamino). Examples of the anion are those of a metal halide such as zinc chloride or stannic chloride, a boron compound such as tetrafluoroborate or tetraphenyl borate, perchloric acid, an organic acid such as p-toluenesulfonic acid, hexafluorophosphate, hexafluoroarsenate, and hexafluoroantimonate. They form normal salts or double salts with the above diazonium compounds to contribute to the enhancement of the solubility of the diazonium salts in organic solvents or their storage stability.

The first group diazonium salts also include polymers obtained by the polycondensation of diazodiphenylamine and formaldehyde. A specific example is a polymer having the following structure:

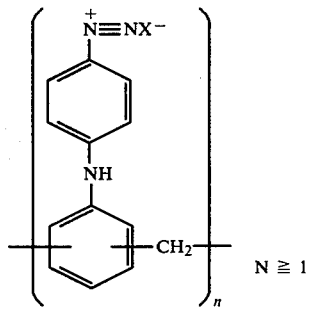

The first group also includes ortho- or para-quinonediazides. Specific examples are as follows:
Naphthalene-1,2-diazooxide-4-sulfonic acid;

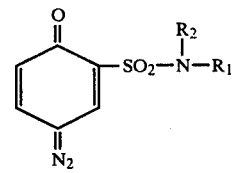

wherein $R_1$ is a hydrogen atom, an alkyl group (e.g., methyl, ethyl, propyl, isopropyl, etc.) or an aralkyl group (e.g., benzyl, phenethyl, etc.), and $R_2$ is an aryl group (e.g., phenyl, tolyl, ethylphenyl, naphthyl, etc.);

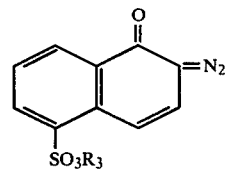

wherein $R_3$ is alkoxy (e.g., methoxy, ethoxy, propoxy, etc.), aryloxy (e.g., phenoxy, tolyloxy, etc.), alkylamino (e.g., methylamino, ethylamino, dimethylamino, diethylamino, etc.), aralkylamino (e.g., benzylamino, dibenzylamino, etc.) or carboxyalkoxylalkyl (e.g., carboxymethoxymethyl, etc.);

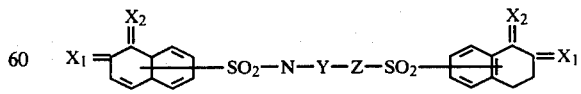

wherein $X_1$ and $X_2$ are $N_2$ or O, Y is arylene (e.g., phenylene, naphthylene, etc.) or alkylene (e.g., methylene, ethylene, trimethylene, tetramethylene, etc.), Z is O or $-NR_4$, $R_4$ is hydrogen, alkyl (e.g., methyl, ethyl, propyl, isopropyl, etc.) or aryl (e.g., phenyl, tolyl, ethylphenyl, naphthyl, etc.).

Especially useful diazonium salts for use in the process of this invention are those which have relatively high solubilities in organic solvents, and can be used in a relatively high concentration relative to the binder in forming an organic solvent solution of a photo-sensitive image-forming composition together with the binder, as will be described hereinbelow.

Usually, two means are available to achieve such conditions. A first means is to render the diazonium cation of the formula $ArN_2^{\oplus}$ in the general formula $ArN_2^{\oplus}.X^{\ominus}$ oleophilic or less hydrophilic by, for example, introducing an alkoxy group into an aromatic ring. A second means is to render the anionic portion $X^{\ominus}$ oleophilic or less hydrophilic, and for this purpose, tetraphenyl borate, tetrafluoroborate, hexafluorophosphate, hexafluoroarsenate, p-toluenesulfonic acid and hexafluoroantimonate are used instead of metal halides which are usually employed. These compounds form double salts together with the diazonium cations to increase their solubility in organic solvents.

As a result, even when a polymer is soluble in an organic solvent is used as a binder, the ratio of the diazonium salt to the binder can be increased to, for example, 1:5 or to 1:1, and a high concentration of the photo-sensitive material can be obtained. Thus, the ease of image formation is markedly enhanced.

These diazonium salts may be those rendered polymeric by known techniques. One example is a so-called diazo resin obtained by polycondensing p-diazodiphenylamine with formaldehyde.

The diazonium salts can also be added together with compounds capable of reacting with diazonium salts to form dyes or stabilizing them which are known to those skilled in the art as diazo couplers. When a diazo coupler is caused to be present together with the diazonium salt, it is possible to perform a coupling reaction after the formation of a relief image on the support, and thereby render the diazonium compound non-sensitive. Hence, the image is stabilized against light or heat and becomes more durable.

Such a diazo coupler may be one which will simultaneously induces a color-forming reaction, but may also be one which merely renders the diazonium compounds non-sensitive, i.e., fixes them. Those having a high molecular weight are especially preferred for the formation of strong images.

Examples of such a diazo coupler are described, for example, at pages 215 to 248 of the above-cited J. Kosar, *Light-Sensitive Systems.*

Aromatic azide compounds which can be used in this invention are those of the general formula $N_3$—R—CH=CH—$R_1$ in which R represents a phenylene group, and $R_1$ represents an acyl group or an azidearyl group. These compounds are known to those skilled in the art from, for example, J. Kosar, *Light-Sensitive Systems,* John Wiley & Sons, Inc., New York (1965), pages 198–202.

Useful azide compounds belonging to another group are those described at pages 93 to 97 of *Photo-Sensitive Resins,* Revised Edition by Takahiro Tsunoda, published by the Publishing Department of the Japanese Society of Printing, 1975. Specifically, they include 2,6-dichloro-4-nitro-azidobenzene, azidodiphenylamine, 3,3'-dimethoxy-4,4'-diazidodiphenyl, 4'-methoxy-4-azidodiphenylamine, 4,4'-diazidodiphenylamine, 4,4'-diazidodiphenylmethane, 4'-nitrophenylazobenzene-4-azide, 1-azidopyrene, 3,3'-dimethyl-4,4'-diazidodiphenyl, 4,4'-diazidophenylazonaphthalene, p-phenylene bisazide, p-azidobenzophenone, 4,4'-diazidobenzophenone, 4,4'-diazidochalcone, 2,6-di-(4'-azidobenzal)cyclohexane and 2,6-di-(4'-azidobenzal)-4-methylcyclohexanone.

In addition to iodoform, carbon tetrabromide and pentabromoethane, compounds of the following formula are also effective as the polyhalogen compound.

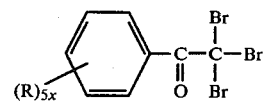

wherein $R_5$ represents hydrogen or one or more of the same or different substituents on the benzene ring. The substituents being a nitro group, a halogen group, an alkyl group (e.g., methyl, ethyl, isopropyl, etc.), a haloalkyl group, an acetyl group, a haloacetyl group, or an alkoxy group (e.g., methoxy, ethoxy, etc.) and x is an integer of 1 to 5.

Specific examples of compounds of the above general formula are o-nitro-$\alpha,\alpha,\alpha$-tribromoacetophenone, 2-chloro-4-nitro-$\alpha,\alpha,\alpha$-tribromoacetophenone, and 2,4-dinitro-$\alpha,\alpha,\alpha$-tribromoacetophenone.

An image-forming process using a silver halide as a photo-sensitive substance is one which is completed at a highest degree as the conventional photographic technique, and is high in the photo-sensitivity and gives rise to an image having quite excellent quality. As a result of extensive studies on the binder, peeling development sheet and peeling development condition when a silver halide is used as a photo-sensitive substance in accordance with the process of this invention, it has been found that any silver halides which meet the following requirements can be applied in the process of this invention.

In general, in the photographic industry the silver halide is prepared in a state in which fine crystals of the silver halide are dispersed in gelatin, such being called a "photographic emulsion". When gelatin as a dispersing medium it is quite difficult to apply silver halides to the process of this invention because the resulting photo-sensitive gelatin-based composition does not have thermoplastic property. However, silver halides can be applied to the process of this invention in accordance with any one of the following methods.

The first method is that fine crystals of the silver halide are recovered by hydrolysis or sedimentation separation of gelatin in a state in which the silver halide fine crystals are separated from the gelatin, and then, the thus recovered silver halide fine crystals are re-dispersed in a fresh thermoplastic binder suitable for the process of this invention (e.g., polyvinyl butyral), the dispersion of which is used in the process. An alternative method is that the amount of gelatin as a dispersing medium for fine crystals of the silver halide is appropriately controlled, and a thermoplastic polymer compatible with gelatin, e.g., polyvinyl alcohol, polyethylene glycol, polymethacrylic acid, or an additive, e.g., ethylene glycol, glycerol, a fatty acid, etc., is mixed therewith to thereby impart a thermoplastic property as a whole.

The use of such silver halide fine crystals in the image-forming process of this invention has various advantages. The most important advantage resides in the high photo-sensitivity which the silver halide possesses. In order that these advantages are made appear, compositions which can be subjected to so-called heat development as a photo-sensitive composition may be used. Examples of such heat development-type silver halide compositions are disclosed in, for example, U.S. Pat. Nos. 3,041,170 and 3,649,280. Suitable examples of peeling development sheet-like carriers which are suitable for the system having a silver halide, as a photo-sensitive substance, are Fuji Laminate Film (a bilayer laminated film consisting of a polyester (polyethylene terephthalate) film and a thermoplastic ionomer produced by Fuji Photo Film Co., Ltd.), polyester films, nylon (polyamide) films and polyimide films. In the case that the binder contains a polymer having a high hydrophilicity, e.g., gelatin, a good result could be obtained by rendering the surface of the peeling development sheet hydrophilic by electric discharge processing or corona discharge treatment, or by providing a thin layer of a hydrophilic polymer.

The mechanism of the image-formation using an image-forming material comprising a photo-sensitive composition containing a silver halide photographic emulsion is quite unknown. However, it may be considered that a halogen released due to the blackening of the silver halide plays some part during the heat treatment.

Various film-forming compounds can be used as a binder for use in the photo-sensitive composition layer. In particular, polymers having good film formability are useful. As will be illustrated hereinbelow, one feature of the process of this invention is that a very broad range of compounds can be used. But it is necessary to select the best binders for the formation of image-forming materials by using the compatibility with photo-sensitive compounds, the stability of the photo-sensitive layer, the adhesion to the support, and other characteristics as criteria.

Examples of suitable polymeric binder compounds include thermoplastic linear polymers such as polyvinyl butyral, polyvinyl formal, polystyrene, poly(methyl methacrylate), polyvinyl acetate, polyesters, polyamines, polyurethane and polyamides; binary copolymers such as a vinylidene/acrylonitrile copolymer, a styrene/acrylonitrile copolymer, a vinyl methyl ether/maleic anhydride copolymer, a vinyl acetate/maleic anhydride copolymer, a vinyl chloride/vinyl acetate copolymer or a vinyl chloride/styrene copolymer, and ternary or quaternary copolymers containing other third and fourth comonomers. Partially crosslinked water-soluble polymers such as gelatin, polyvinyl alcohol or polyvinyl pyrrolidone, and compounds which are not thermoplastic themselves, such as epoxy resins, can be used if they are modified by mixing with thermoplastic binders or other additives to substantially impart heat-softenability to the photo-sensitive composition layer.

Polyethylene glycol, rosin, and waxes which have poor film-formability can be used as binders, but they should be used preferably with other polymeric binders to increase the heat-softenability to the photo-sensitive composition layer. These polymeric substances can be coated on a support as a solution or dispersed in an aqueous or organic solvent as a latex.

Examples of thermoplastic polymers which are particularly suitable for the binder used in the photo-sensitive composition of this invention include vinylidene chloride, a vinylidene chloride/acrylonitrile copolymer, polyvinyl butyral and the like. When the adhesive force of the binder to the peeling development sheet-like carrier at the peeling development treatment temperature employed is too weak, a good result could be obtained by further providing on the photo-sensitive composition layer with a material which is thermoplastic at a relatively low temperature and exhibits tackiness or stickiness, e.g., polyvinyl butyral.

Furthermore, polyvinyl alcohol which is a hydrophilic binder can be advantageously used when the photo-sensitive substance used is hydrophilic. In such a case, a hydrophobic polymer can be used for coating in a latex form.

Plasticizers which are liquid or viscous at room temperature can be added in amounts which do not impair the shape of the photo-sensitive composition layer.

The peeling development in accordance with this invention can also be effected by adding organic or inorganic fine powders such as colloidal silica, starch, carbon black, glass powders and metal powders.

According to the purpose of use of the relief images obtained after peeling development, the photo-sensitive composition layer may also contain pigments or dyes, fine metal powders, and magnetic materials or fluorescent substances in the form of molecularly dispersed state or as crystals or fine powders.

The thickness of the photo-sensitive composition layer is generally from 0.5 $\mu$m to 500 $\mu$m, preferably from 1 $\mu$m to 100 $\mu$m.

The support used to support the photo-sensitive composition in the process of this invention may be any flat materials, for example metal sheets such as aluminum, steel, zinc, iron, stainless steel, and brass and hard non-flexible materials such as glass, ceramics, wood or plastics, and flexible materials such as paper, plastic films, fibrous materials, and vacuum-deposited films. Any of these supports may be further processed at their surfaces by coating, vacuum deposition, lamination, polishing, graining, electrode reaction, electric discharging, heating, and other known means.

According to the purpose of use of the photo-sensitive material, these supports may be transparent, non-transparent, or colored with dyes or pigments.

There is no particular restriction on the thickness or configuration of the support. In the case of a film or sheet, its thickness generally ranges from about 10 micrometers to several centimeters. Those having thicknesses outside this range can also be used if they permit coating and bonding and peeling at the time of heating.

The peeling development carrier used in the process of this invention may be transparent or non-transparent if only it is flexible and has suitable adhesion to the photo-sensitive composition layer at the time of heating in peeling development. Various kinds of peeling development carrier can be used according to the purpose of use of the resulting image. Materials for such a carrier include, for example, thermoplastic films made of vinyl polymers, polyamides, polyesters, celluloses, polyurethane or polyurea, paper, metal foils and cloths. Laminate films and materials obtained by processing the surfaces of these materials by, for example, coating, vacuum deposition, bonding, dyeing, heating or discharging to modify their surface characteristics such as hardness, adhesion and roughness as desired.

The peeling development carrier sheet used in the process of this invention may be of the laminated structure. Examples of suitable laminates are those obtained by laminating a heat-softenable resin layer having a relatively low glass transition point such as polyethylene, polypropylene, saran, polyvinyl butyral, polybutadiene, polyethylene oxide, cellulose triacetate, polystyrene, polyacrylic acid, poly(methyl methacrylate), or an ionomer used in a heat-laminate film (for example, Surlyn A, a tradename for a product of E. I. du Pont De Nemours & Co., U.S.A.) onto a flexible film-like support such as plastic films made of vinyl polymers, polyamides, polyesters, cellulose, polyurethane or polyurea, papers, metal foils and cloths. Of these, a composite film having a thin layer of an ionomer (e.g., Surlyn A) or a thermoplastic polymeric material (e.g., polyethylene) laminated on a polyester (e.g., polyethylene terephthalate) film or the surface of paper, a polyvinyl chloride film and a polystyrene film are representative as suitable peeling development carriers. Furthermore, a polyester (e.g., polyethylene terephthalate) film or a cellulose acetate (e.g., cellulose diacetate, cellulose triacetate, etc.) film can also be exemplified as suitable peeling development carriers if a high temperature is chosen as the heating temperature. Still further, when the themoplastic binder polymer per se which is contained in the photo-sensitive composition has a strong adhesive force at the heating temperature employed and has a weak cohesive force in the photo-sensitive composition layer, paper can be used as the peeling development carrier of this invention.

In the process of this invention, the peeling development carrier is applied after imagewise exposing the photo-sensitive layer, and therefore, the peeling development carrier may be transparent or non-transparent, or colored, or filled with an inorganic or organic pigment or solid powder. For example, a structure obtained by laminating a $TiO_2$ powder onto a polyester film using cellulose triacetate as a binder is a very good carrier for peeling development.

The thickness of the carrier must be sufficient to give the strength required to peel the exposed or unexposed area of the photo-sensitive composition layer without breakage at the time of peeling development. A single layer or laminated plastic film or paper generally has a thickness of 10 μm to 2 mm, preferably from 15 μm to 0.5 mm.

In the heat laminating operation in the process of this invention, the required temperature differs according to the constructions of the photo-sensitive composition layer and the peeling development sheet, the heat-softening temperature, the combination of the photo-sensitive composition layer and the developing sheet, etc. If the temperature is too low, the photo-sensitive layer does not adhere to the developing sheet. Even when they are press-bonded with rollers, etc., the adhesive strength required for effective peeling cannot be obtained. When the temperature is too high, the photo-sensitive layer and the peeling development sheet are heat-softened markedly, and may finally assume flowability. Thus, moderate peel images cannot be obtained, and the images are very reduced in quality.

As is clear from the foregoing description, for image formation by peeling, the materials and constructions of the support, photo-sensitive layer, and the peeling development sheet, and the combination of these are very important, and the developing conditions cannot be simply defined. The optimum temperature can, however, be determined without an undue amount of experimentation on the part of the skilled artisan. Generally, however, the heat laminating temperature is from 50° to 300° C., preferably from 80° to 200° C.

The peeling development sheet and the photo-sensitive image-forming material which have been thus heat laminated are separated by a peeling operation. The temperature at the time of peeling is also very important. Generally, the temperature at the time of peeling is below the temperature, which is 50° C. or higher, at which the photo-sensitive image-forming material and the peeling development image are intimately adhered and heated.

Generally, when the softening temperature of the photo-sensitive composition layer is low and the peeling temperature is higher than the softening temperature, cohesive destruction of the photo-sensitive composition layer occurs whereby a part of the area of the photo-sensitive layer which is to be separated by peeling development adheres to the support, and a part of the area which is to remain adhered to the support adheres to the peeling development sheet. Thus, the resulting relief image tends to be incomplete. When the peeling temperature is higher than the softening temperature of the adhesive surface of the peeling development carrier sheet, the peeling development carrier sheet (or an adhesive layer when a heat-softenable layer is laminated on another support as an adhesive layer) breaks or undergoes cohesive destruction. Hence, good quality relief images cannot be obtained.

Of course, the adhesive strength between the photo-sensitive composition layer and the support carrier affects the formation of relief images by peeling.

The peeling temperature which is optimal for the process of this invention also varies widely according to the combination of the supporting carrier, photo-sensitive composition layer and the peeling development sheet. Generally, the peeling temperature is from room temperature to 200° C., preferably from room temperature to 150° C.

Figure 2:
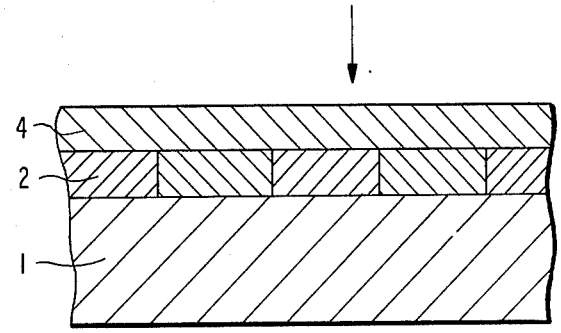
FIG. 2 illustrates the exposed image-forming material in intimate contact with the peeling development carrier sheet.
Figure 3:
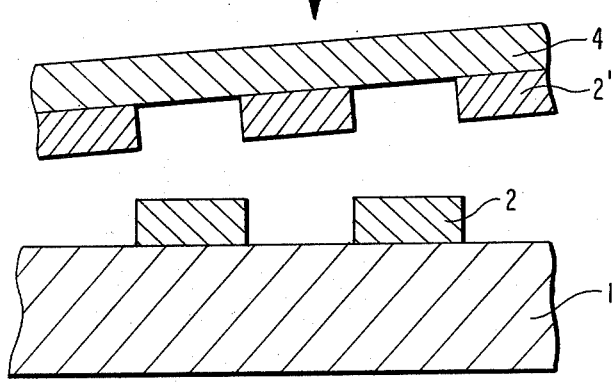
FIG. 3 shows separation of the peeling development carrier sheet from the image-forming material.
Figure 4:
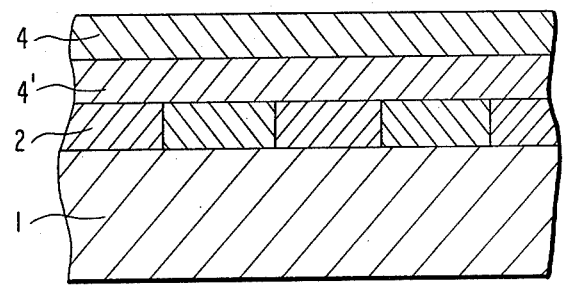
FIGS 4 and 5 illustrate further embodiments of the invention.
Figure 5:
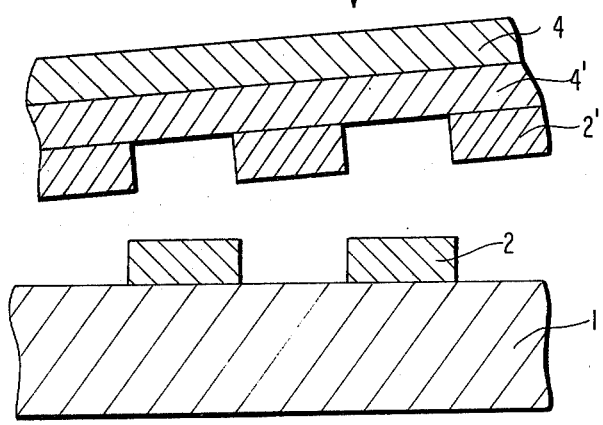

Embodiments of the construction of the photo-sensitive image-forming material used in the invention and the process for image formation in accordance with this invention are described by reference to the accompanying drawings in which FIGS. 1 to 3 show one embodiment of the process for image formation in accordance with this invention; and FIGS. 4 and 5 show another embodiment of the process of this invention.

FIG. 1 illustrates the exposure of a photo-sensitive image-forming material in accordance with this invention through a transparency. The photo-sensitive image-forming material composed of support 1 and photo-sensitive layer 2 formed thereon is imagewise exposed through transparency 3. FIG. 2 shows the exposed image-forming material in intimate contact with the peeling development carrier 4 under heat. FIG. 3 illustrates separation of the peeling development carrier from the image-forming material. The exposed area 2' of the photo-sensitive layer is transferred and adhered to the peeling development carrier sheet, and the unexposed area 2 remains on the support, respectively, forming a relief image in both locations.

FIGS. 4 and 5 show another embodiment of the process of this invention. The photo-sensitive image-forming material consisting of photo-sensitive composition layer 2 and the support 1 is imagewise exposed, and brought into intimate contact with the peeling development carrier having a heat-softenable layer 4' under heat (FIG. 4). Subsequently, they are separated from each other, whereby the exposed area 2' of the photo-sensitive layer is transferred and adhered to the peeling development carrier, and the non-exposed area 2 remains on the support, respectively forming a relief image (FIG. 5) in both locations.

The following Examples illustrate the present invention in more detail. It should be understood however that the invention is in no way limited by these Examples.

EXAMPLE 1

2,5-Dibutoxy-4-N,N-dimethylaminobenzenediazonium zinc chloride double salt (0.2 g) and 2 g of a novolak resin (PR 50904, a product of Arakawa Rinsan Co., Ltd.) were dissolved in a mixed solvent consisting of 20 ml of N,N-dimethylformamide and 20 ml of tetrahydrofuran to form a photo-sensitive solution. The photo-sensitive solution was uniformly coated on an aluminum substrate using a whirler to form a photo-sensitive composition layer having a dry film thickness of about 4 microns. The resulting photo-sensitive image-forming material was exposed for 10 seconds to light from a high-pressure mercury lamp (100 W) disposed at a distance of 20 cm, through a positive transparency intimately adhering to it. Then, the heat-laminate film (Fuji Laminate Film, a product of Fuji Photo Film Co., Ltd.) was laid on the exposed image-forming material, and the assembly was passed between heated rollers held at a roller temperature of 130° C. to effect heat lamination. Immediately then, the laminate film was separated from the image-forming material.

A positive relief image of good quality consisting of the unexposed area of the photo-sensitive composition layer was obtained on the aluminum substrate. On the other hand, a negative relief image consisting of the exposed area of the photo-sensitive composition layer was obtained on the development carrier sheet.

EXAMPLE 2

4-Morpholinobenzenediazonium boron tetrafluoride double salt (2 g) and 2 g of a copolymer of vinylidene chloride and acrylonitrile (Saran F-220, a product of Asahi-Dow Co., Ltd.) were dissolved in 20 ml of N,N-dimethylformamide to form a photosensitive solution. The photo-sensitive solution was coated on an aluminum substrate which had been grained and anodized, thereby to form a photo-sensitive image-forming material. The image-forming material was exposed for 100 seconds through a positive photographic transparency intimately adhering to it to light from a 100 W high-pressure mercury lamp disposed at a distance of 20 cm. The same heat-laminate film as used in Example 1 was overlaid on the exposed image-forming material, and the assembly was passed between heated rollers held at a roller temperature of 150° C. The passing time was about 7 seconds. Immediately after passage between the rollers, the image-forming material was separated from the development carrier sheet. A positive relief image of good quality was formed on the aluminum substrate, and a negative relief image, on the laminate film.

EXAMPLE 3

Polyvinyl butyral (Denka Butyral 4002, a product of Denki Kagaku Kabushiki Kaisha) was used as a binder instead of the Saran used in Example 2. The procedure of Example 2 was repeated, to thereby form a positive image of good quality on the aluminum substrate.

EXAMPLE 4

The procedure of Example 2 was repeated except that a styrene/acrylonitrile copolymer was used as a binder instead of Saran in Example 2. A positive image of good quality was obtained on the aluminum substrate.

EXAMPLE 5

The procedure of Example 2 was repeated except that 4-N,N-dimethylaminobenzenediazonium boron tetrafluoride double salt was used instead of the diazonium salt used in Example 2. A negative image of good quality was obtained on the aluminum substrate.

EXAMPLE 6

The photo-sensitive image-forming material of in Example 5 was prepared, and Example 5 was repeated except that after heat bonding, the assembly was allowed to stand for a while until it returned to room temperature, and then it was separated. A positive image of good quality was formed on the aluminum substrate, and the corresponding negative image, on the peel sheet.

EXAMPLE 7

The procedure of Example 2 was repeated except that 2 g of ethyl ether of 2-diazo-1-naphthol-5-sulfonic acid was used as the photo-sensitive ingredient used in Example 2. A positive image of good quality was obtained on the aluminum substrate.

EXAMPLE 8

The procedure of Example 2 was repeated except that 4-N,N-diethylaminobenzenediazonium boron tetrafluoride double salt was used as the photo-sensitive ingredient used in Example 2. A negative image of good quality was obtained on the aluminum substrate.

EXAMPLE 9

The procedure of Example 2 was repeated except that a smooth aluminum plate not anodized was used as a support. A positive relief image of good quality was obtained on the aluminum substrate.

EXAMPLE 10

The procedure of Example 2 was repeated except that a polyethylene terephthalate film having about 1000 A thick aluminum layer formed on by vacuum deposition was used as the support instead of the support used in Example 2. A positive relief image of good quality was obtained on the aluminum-deposited film.

EXAMPLE 11

The procedure of Example 2 was repeated except that a polyethylene terephthalate film having a snubbing layer of gelatin was used as the support instead of the aluminum plate used in Example 2. A positive relief image of good quality was obtained on the support.

EXAMPLE 12

The procedure of Example 2 was repeated except that an aluminum substrate having a coated layer of polyvinyl alcohol with a thickness of 1 μm was used as the support instead of the aluminum plate used in Example 2. A positive relief image of good quality was obtained on the support.

EXAMPLE 13

The procedure of Example 2 was repeated except that a photographic baryta paper having a gelatin layer was used instead of the aluminum plate used in Example 2. A positive image of good quality was obtained on the baryta paper.

EXAMPLE 14

The procedure of Example 2 was repeated except that a polyvinyl chloride film was used as the peeling sheet instead of the heat-laminated film used in Example 2. A negative image of good quality was obtained on the aluminum substrate.

EXAMPLE 15

The procedure of Example 2 was repeated except that a polyethylene terephthalate film was used as the peeling development sheet instead of the heat-laminate film used in Example 2. A positive image of good quality was obtained on the aluminum substrate.

EXAMPLE 16

The procedure of Example 2 was repeated except that a paper having a polyethylene film laminated to it was used as a peeling sheet instead of the heat-laminate film used in Example 2. A positive image of good quality was obtained on the aluminum substrate.

EXAMPLE 17

One gram of 4-N,N-dimethylaminobenzenediazonium boron tetrafluoride double salt and 3 g of a vinylidene chloride/acrylonitrile copolymer (Saran F-220, a product of Asahi Chemical Industry Co., Ltd.) were dissolved in 45 ml of N,N-dimethylformamide to form a photo-sensitive solution. An aluminum substrate having a width of 23 cm and a length of 46 cm which had been grained and anodized was set on a whirler, and at a rotating speed of 100 rpm, 50 ml of the resulting photo-sensitive solution was cast onto the aluminum substrate. Then, the coating was dried with hot air, and heat-dried for 100 seconds in a constant temperature tank at 100° C. to form a photo-sensitive printing material. The film thickness of the photo-sensitive layer of this photo-sensitive printing material was about 4 microns. The printing material was contacted closely with a positive test chart original containing various halftone wedges under vacuum, and exposed for 20 seconds to light from a 2 KW ultra-high pressure mercury lamp (Jet Light, a trademark for a product of Orc Manufacturing Co., Ltd.) placed at a distance of 50 cm.

Then, the exposed material was held in intimate contact with the laminate layer of a heat-laminate film obtained by laminating a thermoplastic ionomer to a polyethylene terephthalate film (Fuji Laminate Film, a product of Fuji Photo Film Co., Ltd.), and the assembly was passed through a small-sized heat laminate (Fuji Laminater D-13,, a product of Fuji Photo Film Co., Ltd.) held at a roller temperature of 150° C. to heat-bond the photosensitive material and the laminate film on the laminater. Immediately after the passage of the material through the laminater, the laminate film was peeled from the photo-sensitive material.

On the aluminum substrate, only the unexposed area of the photo-sensitive composition layer remained to form a positive relief image of good quality. On the other hand, all of the exposed area of the photo-sensitive layer moved to the laminate film to form a negative relief image of good quality.

The printing palte so obtained was gummed by a gum solution ("Fuji PS Plate Gum Solution GU", a product of Fuji Photo Film Co., Ltd.), and then test printing was performed on an offset printing press (Hamada Star 600 CD). Very good copies were obtained from the beginning of printing to the time when the 5000th copy was obtained. By using a halftone measuring device (Veuvac, a product of Toyo Ink Mfg. CO., Ltd.), the reproducibility of halftones was examined. It was confirmed that an original of 175 lines/inch was reproduced on the printing plate and on the printed copies over a halftone area of 5% to 95%.

A tone reproduction graph obtained by plotting the halftone percentage of the printed copy against the halftone percentage on the original gave substantially the same type of curve as that of a control test printing operation which was performed under the same conditions as above by using a printing plate by solution development of a commercially available diazo PS plate (PS plate GAP, a product of Fuji Photo Film Co., Ltd.) in a specified manner.

EXAMPLE 18

One gram of p-anilinobenzenediazoniumhexafluorophosphate, 2 g of polyurethane and 0.1 g of $\alpha$-naphthol were dissolved in 30 ml of N,N-dimethylformamide to form a photo-sensitive solution. In the same manner as in Example 1, the photo-sensitive solution was coated on a grained aluminum substrate, and dried. The resulting photo-sensitive image-forming material was exposed through a positive transparency in the same way as in Example 1, and then developed using a heat-laminate film (Fuji Laminate Film, a product of Fuji Photo Film Co., Ltd.) thereby to form a positive relief image on the aluminum substrate. The aluminum substrate was treated for 1 minute with 10.5% ammonia solution. The undercomposed diazonium salt forming the relief image on the substrate was coupled with $\alpha$-naphthol to form a reddish brown image. The resulting image was fixed, and therefore did not have photo-sensitivity. It was stable to light, and the physical strength of the relief image itself also increased.

EXAMPLE 19

Ten grams of iodoform, 10 g of phloroglucinol and 20 g of m-cresol-type novolak resin are dissolved in 20 ml of methyl ethyl ketone to form a photo-sensitive solution. The photo-sensitive solution was coated by means of a whirler on an aluminum plate which had been grained and anozided; and then dried with hot air at 60° C. for 5 minutes to form a photo-sensitive image-forming material. The thickness of the photo-sensitive composition was about 3 microns. The image-forming material was exposed for 15 seconds from a 2 KW ultra-high pressure mercury lamp disposed at a distance of 50 cm through a positive lithographic film formed by using halftone dots with 150 lines per inch which was intimately contacted with the photo-sensitive image-forming material. A dark green printout image of good quality was obtained on the exposed area. Then, the photo-sensitive image-forming layer of the material was superimposed on the laminate layer of a heat-laminating film obtained by laminating a thermofusible ionomer on a polyethylene terephthalate film having a thickness of 80 $\mu$m (Fuji Laminate Film, a product of Fuji Photo Film Co., Ltd.), and the assembly was passed through a heat laminater held at a roller temperature of 120° C. (Laminater D-13, a product of Fuji Photo Film Co., Ltd.) to heat-bond the laminate film to the material. Immediately after the passage of the material between the laminator rollers, the laminate film was peeled off from the material. A positive image of good quality was formed on the aluminum substrate, and simultaneously, the corresponding negative image was obtained on the laminate film.

The resulting printing plate was gummed with a gum solution GU for a PS plate (a product of Fuji Photo Film Co., Ltd.), an then test printing was performed on an offset printing press (Hamada Star 600 CD). Good printed copies were obtained from the beginning of printing to the time when the 500th copy was obtained. The halftone dots in the original were well reproduced in a percentage of 10% to 90%.

EXAMPLE 20

One gram of iodoform, 1 g of phloroglucinol and 2 g of m-cresol type novolak resin were dissolved in 20 ml of methyl ethyl ketone to form a photo-sensitive solution. The solution was coated on an anozided aluminum plate which was rotated at a speed of about 120 revolutions per minute, and dried for 5 minutes with hot air at 60° C. to form a photo-sensitive image-forming material. The photo-sensitive layer of this material was about 2 microns. The photo-sensitive image-forming material was exposed for 100 seconds to light from a 100 W high-pressure mercury lamp disposed at a distance of 20 cm through a positive image-bearing transparency which was held in intimate contact with the photo-sensitive material. An image of pink color was formed in the exposed area. Then, a Fuji Laminate layer was laid over the photo-sensitive layer of the image-forming material, and the assembly was passed between heated rollers held at a roller temperature of 120° C. Immediately after passage between the rollers, the laminate film was peeled from the material. A positive image of good quality was formed on the aluminum substrate, and a negative image, on the laminate film.

EXAMPLE 21

The procedure of Example 19 was repeated except that a paper surface-treated with polyethylene was used instead of the heat-laminate film used in Example 19. A positive image of good quality was obtained on the aluminum substrate.

EXAMPLE 22

The procedure of Example 19 was repeated except that a cellulose triacetate film was used as a peeling sheet instead of the heat-laminate film used in Example 19. A positive image of good quality was obtained on the aluminum substrate.

EXAMPLE 23

The procedure of Example 19 was repeated except that pentabromoethane was used instead of iodoform used in Example 19. A positive image of good quality was obtained on the aluminum substrate.

EXAMPLE 24

The procedure of Example 19 was repeated except that carbon tetrabromide was used instead of iodoform used in Example 19. A positive image of good quality was obtained on the aluminum substrate.

EXAMPLE 25

One gram of iodoform, 1 g of phloroglucinol, 2 g of m-cresol type novolak resin and 0.5 g of polyethylene glycol having a degree of polymerization of about 2000 were dissolved in 20 ml of ethylene glycol monomethyl ether. The solution was coated on an anodized aluminum plate and dried. The thickness of the photo-sensitive composition layer was about 5 microns. The resulting photo-sensitive image-forming material was treated in the same way as in Example 19. A positive image was obtained on the aluminum substrate, and a negative image, on the laminate film.

EXAMPLE 26

One gram of phenanthraquinone and 4 g of polyvinyl butyral were dissolved in 50 ml of dimethyl formamide to form a photo-sensitive solution. A grained and anodized aluminum substrate having a thickness of 0.24 mm was set on a rotary disc, and rotated at a speed of 100 rpm. In this state, the photo-sensitive solution was cast on the aluminum substrate, and dried for 5 minutes with hot air at 80° C. to form a photo-sensitive image-forming material. The material was exposed for 100 seconds to light from a 100 W high-pressure mercury lamp disposed at a distance of 20 cm through a positive transparency firmly adhering to the material. After exposure, the same Fuji Laminate Film as used in Example 17 was laid over the exposed material, and the assembly was passed between hot rollers held at a roller temperature of 150° C., and then the peeling film was peeled from the material. A positive relief image of good quality was formed on the aluminum substrate, and the corresponding negative relief image, on the laminate film.

EXAMPLE 27

The following procedure was performed under a red safelight for photographic processing until the end of peeling development.

Twenty grams of an unsensitized silver chloride emulsion (containing 15% of silver; particle size of 0.3 $\mu m$; crystal type, cubes with rounded corners) used for a black-and-white photographic paper was dissolved by heating it to 50° C., and then mixed with 0.1 ml of a 1% alcohol solution of 1-phenyl-5-mercaptotetrazole, 2 ml of a 10% alcohol solution of 1-phenyl-3-pyrazolidone, 2 ml of 10% aqueous solution of urea, 4 g of sucrose, and 0.1 g of colloidal silica to form a photo-sensitive solution.

A smooth aluminum substrate having a thickness of 0.24 mm was set on a rotary disc, and rotated at a speed of 200 rpm, and in this state, the photo-sensitive solution was cast and dried for 5 minutes with hot air at 100° C. After drying, the thickness of the photo-sensitive composition layer was about 6 $\mu m$. The resulting image-forming material was exposed for 5 seconds to light from a 1 KW halogen lamp disposed at a distance of 10 cm through a positive transparency intimately adhering to it and through and ND filter (OD 2).

A polyethylene terephthalate film having a photographic subbing layer formed on it was laid over the exposed image-forming material, and the assembly was passed between hot rollers held at a roller temperature of 170° C. It was allowed to stand for some time and when the temperature of the substrate reached about 100° C., the peeling sheet was peeled off from the image-forming material.

A negative relief image composed of the unexposed area of the silver chloride emulsion layer was formed on the aluminum substrate, and a positive relief image composed of the corresponding exposed area, on the peel sheet.

EXAMPLE 28

Fifty grams of the same silver chloride emulsion as used in Example 25 was dispersed in 450 ml of water at 50° C. Then, 0.1 g of protease was added, and the mixture was treated for 3 hours. The mixture was centrifuged for 30 minutes at 2000 XG to separate and recover silver chloride grains. Re-dispersion in washing water and centrifugation were repeated to remove the excess of the gelatin. All of the washed silver chloride grains were dispersed in 40 g of an ethyl alcohol solution containing 10% of polyvinyl alcohol, and 2 ml of a 10% ethanol solution of hydroquinone was added to form a photo-sensitive solution.

A grained and anodized aluminum substrate having a thickness of 0.24 mm was set on a rotary disc, and rotated at a speed of 200 rpm. In this state, the photo-sensitive solution was cast onto the aluminum substrate, and dried for 5 minutes with hot air at 80° C. to form a photo-sensitive image-forming material. The thickness of the photo-sensitive composition layer was about 7 μm. The image-forming material was exposed for 1 second to light from a 1 KW xenon lamp disposed at a distance of 60 cm through a positive transparency intimately adhering to the material.

After the exposure, the same Fuji Laminate Film as used in Example 26 was laid over the exposed material, and the assembly was passed between hot rollers held at a roller temperature of 150° C. to heat-laminate the peel sheet. Immediately then, the sheet was peeled from the photo-sensitive image-forming material. The photo-sensitive layer at the exposed area moved completely to the surface of the peel sheet to form a negative relief image composed of blackened silver. On the other hand, a positive relief image composed of the photo-sensitive layer at the unexposed area was obtained on the aluminum substrate. When it was allowed to stand under natural light, the silver chloride gradually printed out until a pure black positive image was obtained. Since the exposed area of the photo-sensitive layer moved almost completely to the surface of the peel sheet, there was scarcely any fog on the images on the aluminum substrate.

EXAMPLE 29

A photo-sensitive solution was prepared in accordance with the following procedure.

Behenic acid (34 g) was mixed with 500 ml of water. The mixture was heated to 85° C. to melt behenic acid. While the mixture of water and behenic acid melted at 85° C. was stirred at a speed of 1800 rpm, an aqueous solution of sodium hydroxide (2.0 g of sodium hydroxide + 50 ml of water) at 25° C. was added over the course of 3 minutes to form a mixture of sodium behenate and behenic acid. Then, with stirring at 1800 rpm, the temperature was lowered from 85° C. to 30° C.

Then, with continued stirring, an aqueous solution of silver nitrate (8.5 g of silver nitrate + 50 ml of water) at 25° C. was added over the course of 3 minutes, and the mixture was further stirred for 90 minutes. Then 200 ml of isoamyl acetate was added, and the resulting silver behenate particles were recovered. The silver behenate particles were then dispersed in an isopropyl alcohol solution of polyvinyl butyral (25 g of polyvinyl butyral + 200 ml of isopropyl alcohol) by means of a homogenizer (at 25° C. and 3000 rpm for 30 minutes) to prepare a polymer dispersion of silver behenate.

Then, the polymer dispersion of silver behenate was maintained at 50° C., and with stirring at 500 rpm, and acetone solution of N-bromosuccinimide (0.7 g of N-bromosuccinimide + 50 ml of acetone) at 25° C. was added over the course of 90 minutes. The mixture was further stirred for 60 minutes to form a polymer dispersion of silver bromide and silver behenate.

One-twelfth (1/240 mole) of the resulting polymer dispersion of silver bromide and silver behenate was collected, and maintained at 30° C. With stirring at 200 rpm, the following ingredients (1) to (6) were added at 5 minute intervals to form a photo-sensitive solution.

(1) 2 ml of a merocyanine dye (sensitizing dye) of the following formula as a 0.025% by weight methyl cellosolve solution.

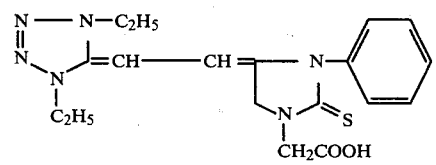

(2) 2 ml of sodium benzenethiosulfonate as a 0.01% by weight methanol solution.

(3) 2 ml of m-nitrobenzoic acid as a 0.5% by weight ethanol solution.

(4) 5 ml of phthalazinone as a 4.5% by weight methyl cellosolve solution.

(5) 10 ml of phthalimide as a 4% by weight methyl cellosolve solution.

(6) 10 ml of o-bisphenol (reducing agent) of the following formula as a 10% by weight acetone solution.

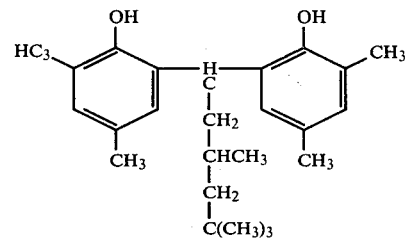

A grained and anozided aluminum substrate having a thickness of 0.24 mm was set on a rotary disc, and rotated at a speed of 100 rpm. In this state, the resulting photo-sensitive solution was cast and dried for 5 minutes with hot air at 60° C. to form a photo-sensitive image-forming material. The thickness of the photo-sensitive composition layer was about 5 μm. The resulting photo-sensitive image material was exposed for 5 seconds to light from a 1 KW halogen lamp disposed at a distance of 10 cm through a positive transparency intimately adhered to it and through an ND filter (OD 2). After the exposure, a polypropylene film was brought into intimate contact with the exposed image-forming material, and the assembly was passed between hot rollers held at a roller temperature of 130° C. Immediately then, the polypropylene film was peeled off from the image-forming material.

A positive relief image was formed on the aluminum substrate, and a negative relief image composed of blackened silver, on the peel sheet.

EXAMPLE 30

The procedure of Example 28 was repeated except that a polyethylene terephthalate film having a subbing layer of polyvinyl alcohol was used as a support instead of the aluminum substrate used in Example 28.

A positive relief image was obtained on the support, and the corresponding negative relief image, on the peel sheet.

While the invention has been described in detail and with reference to specific embodiments thereof, it will be apparent to one skilled in the art that various changes and modifications can be made therein without departing from the spirit and scope thereof.

What we claim is:

1. A process for forming an image, which comprises imagewise exposing a photo-sensitive image-forming material composed of a support and a layer of a thermoplastic photo-sensitive composition which is not adhesive at ordinary temperatures, heating the exposed photo-sensitive material in intimate contact with a peeling development carrier sheet at least one surface of which is composed of a thermoplastic material not adhesive at ordinary temperature to a temperature above the softening temperature of at least one of the photo-sensitive composition layer and the peeling development carrier sheet, and then peeling development carrier sheet from the photo-sensitive image-forming material at about or below said heating temperature thereby to form the exposed or unexposed area of the photo-sensitive composition layer on the peeling development carrier sheet, and the corresponding unexposed or exposed area on the support, respectively as a separate image wherein said photo-sensitive composition contains a photo-sensitive polyhalogen compound, a photo-sensitive quinone, a photo-sensitive polymer, a silver halide or an organic silver salt.

2. The process of claim 1, wherein said photo-sensitive composition contains a polyhalogen compound in combination with a diphenylamine, a naphthol or a phenol.

3. The process of claim 1, wherein said photo-sensitive composition contains a phenanthraquinone, a naphthoquinone, or a benzoquinone and a metal complex salt.

4. The process of claim 1, wherein said photo-sensitive composition contains a silver halide dispersed in a binder containing a thermoplastic polymer.

5. The process of claim 1, wherein said photo-sensitive composition contains an organic silver salt dispersed in a binder containing a thermoplastic polymer.

6. The process of claims 4 or 5 wherein said binder contains polyvinylalcohol, polyethylene glycol or polymethacrylic acid.

7. The process of claims 4 or 5 wherein said binder contains ethylene glycol, glycerol or a fatty acid to impart thermoplastic property thereto.

8. The process of claim 1 wherein said thermoplastic photo-sensitive composition contains a thermoplastic binder selected from the group consisting of vinylidene chloride, vinylidene chloride-acrylonitrile copolymer and polyvinyl butyral.

9. The process of claim 1 wherein said peeling development carrier sheet is a laminate of an ionomer or a thermoplastic polymer on a polyester support.

10. The process of claim 1 wherein said peeling development carrier sheet is a polyvinyl chloride film, a polystyrene film, a polyester film or a cellulose acetate film.

11. The process of claim 1, wherein said heating is at a temperature high enough to obtain sufficient adhesion between the photo-sensitive composition and the peeling development carrier sheet such that quality images can be peeled from the support but low enough that the photo-sensitive composition and the peeling development carrier sheet are not softened to the point at which good image quality is not obtained.

12. The process of claim 1, wherein said heating temperature is 50° to 300° C.

13. The process of claim 1, wherein said peeling is carried out at a temperature below the heating temperature.

14. The process of claim 1, wherein said peeling temperature is below the softening point of said photo-sensitive composition and said peeling development carrier sheet.

15. The process of claim 1, wherein said peeling temperature is from room temperature to 200° C.

16. The process of claim 1, wherein said photo-sensitive composition has a softening point at least 10° C. higher than ordinary temperatures.

17. The process of claim 1, wherein said layer of said photo-sensitive composition and said peeling development carrier sheet have a softening point equal to or higher than 50° C.

18. The process of claim 1, wherein said intimate contact beween said layer of photo-sensitive composition and peeling development carrier sheet is accomplished by passing said image-forming material and said carrier sheet in superposed relation between a plurality of heated rollers under pressure.

* * * * *